United States Patent [19]
Pickett et al.

[11] Patent Number: 4,942,319
[45] Date of Patent: Jul. 17, 1990

[54] MULTIPLE PAGE PROGRAMMABLE LOGIC ARCHITECTURE

[75] Inventors: Scott K. Pickett, San Jose; Thomas M. Luich, Campbell, both of Calif.; Arthur L. Swift, IV, Welches, Oreg.

[73] Assignee: National Semiconductor Corp., Santa Clara, Calif.

[21] Appl. No.: 299,047

[22] Filed: Jan. 19, 1989

[51] Int. Cl.$^5$ .......................................... H03K 19/177
[52] U.S. Cl. .................................. 307/465; 307/243; 307/468; 364/716
[58] Field of Search ............................... 307/465–469, 307/480, 243; 364/716; 340/825.83, 825.87, 825.91; 365/238.5, 230.02–230.04

[56] References Cited

U.S. PATENT DOCUMENTS

| | | | |
|---|---|---|---|
| 3,593,317 | 7/1971 | Fleisher et al. | 340/825.83 |
| 3,849,638 | 11/1974 | Greer | 307/465 |
| 4,034,356 | 7/1977 | Howley et al. | 307/465 X |
| 4,124,899 | 11/1978 | Birkner et al. | 364/716 |
| 4,233,667 | 11/1980 | Devine et al. | 364/716 X |
| 4,293,783 | 10/1981 | Patil | 307/465 |
| 4,415,818 | 11/1983 | Ogawa et al. | 364/716 X |
| 4,422,072 | 12/1983 | Cavlan | 340/825.87 |
| 4,495,590 | 1/1985 | Mitchell | 364/716 |
| 4,506,173 | 3/1985 | Yum | 307/466 |
| 4,506,341 | 3/1985 | Kalter et al. | 364/716 X |
| 4,583,193 | 4/1986 | Kraft et al. | 364/716 X |
| 4,617,649 | 10/1986 | Kyomasu et al. | 365/189 |
| 4,660,171 | 4/1987 | Moore et al. | 340/825.83 |
| 4,675,556 | 6/1987 | Bazes | 307/465 |
| 4,677,318 | 6/1987 | Veenstra | 307/465 |
| 4,703,206 | 10/1987 | Cavlan | 307/465 |
| 4,742,252 | 5/1988 | Agrawal | 307/465 |
| 4,758,746 | 7/1988 | Birkner et al. | 307/465 |
| 4,758,993 | 7/1988 | Takemae | 365/230.03 X |
| 4,763,020 | 8/1988 | Takata et al. | 307/465 |
| 4,763,302 | 8/1988 | Yamada | 365/230.04 X |
| 4,802,135 | 1/1989 | Shinoda et al. | 365/238.5 X |
| 4,812,678 | 3/1989 | Abe | 307/465 X |

OTHER PUBLICATIONS

L. D. Whitley, IBM Technical Disclosure Bulletin (1981), vol. 24, No. 6, "PLA Having OR-Array Bit Partitioning".

S. B. Greenspan, IBM Technical Disclosure Bulletin (1976), vol. 19, No. 5, "Multiple Partitioned Programmable Logic Array".

*Primary Examiner*—Stanley D. Miller
*Attorney, Agent, or Firm*—Steven F. Caserza; Lee Patch

[57] ABSTRACT

A PLA is organized into a plurality of pages of programmable logic arrays, including means for selecting an appropriate set of one or more of the plurality of pages of programmable logic arrays, including means for selecting an appropriate set of one or more of the plurality of pages for operation at any given time. Means are provided for switching pages when necessary in response to input signals including, if desired, signals fed back from the output leads of the PLA, or internal leads within the PLA. By having only a selected one or more of the pages of the PLA operable at any given time, the number of product and sum terms functioning at any given time is significantly less than the total number of product and sum terms available in the device, thereby minimizing power consumption. Furthermore, by utilizing a paged architecture, speed is increased and power consumption reduced since the number of leads connected to, and thus the capacitance of, the product and/or sum term lines is reduced.

32 Claims, 17 Drawing Sheets

MULTIPLE PAGE PROGRAMMABLE LOGIC ARCHITECTURE

MULTIPLE PAGE PROGRAMMABLE LOGIC ARCHITECTURE

BACKGROUND

This invention pertains to programmable logic devices (PLDs), and particularly to a novel PLD device architecture including a plurality of pages, with a single page, or a selected set of pages, being selected at any given time.

DESCRIPTION OF THE PRIOR ART

Figure 1:
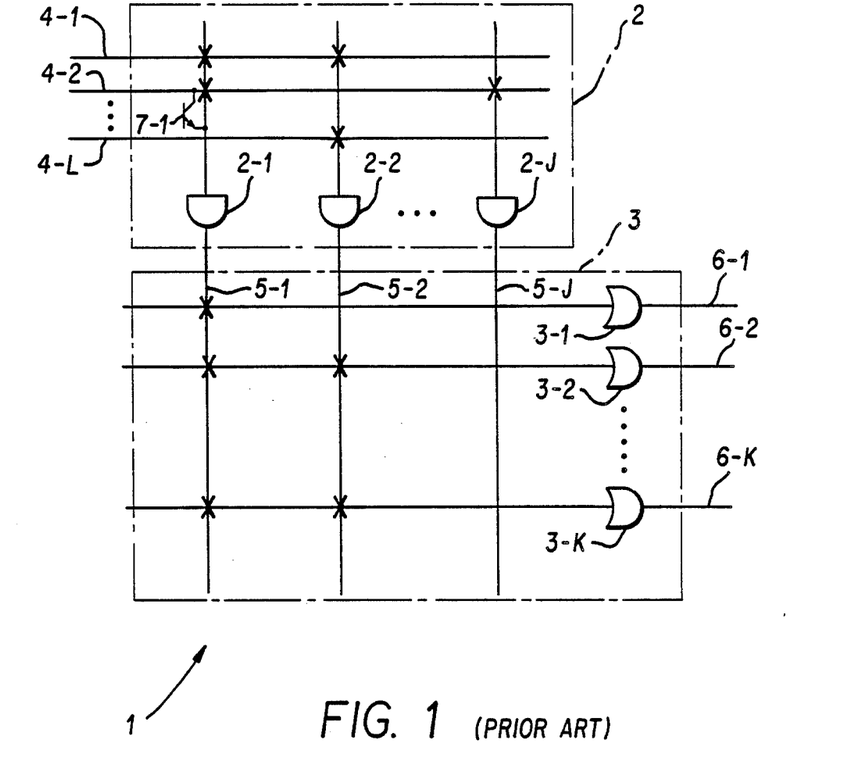
FIG. 1 is a diagram depicting a typical programmable logic array.

Programmable logic devices are well known in the prior art and, as shown in FIG. 1, typically include AND array 2 for receiving a plurality of L input signals on input leads 4-1 through 4-L and providing a plurality of product terms by performing logical AND operations on selected ones of the input signals. PLDs can be fabricated using any desired semiconductor technology, including bipolar, MOS, CMOS and gallium arsenide. As shown in FIG. 1, each AND gate 2-1 through 2-J within AND array 2 is an L input lead AND gate, and interconnection means such as fuse devices are used to connect desired ones of the input leads of a given AND gate to desired ones of input leads 4-1 through 4-L. For the sake of simplicity, only a single input line is shown to each AND gate 2-1 through 2-J, and Xs are shown to indicate low impedance connections between an input lead of a given AND gate, and an input lead 4-1 through 4-L. One example of a fused device providing a low impedance connection between input lead 4-2 and an input lead of AND gate 2-1 is shown as floating base NPN transistor 7-1.

The product terms available on output leads 5-1 through 5-J of AND gates 2-1 through 2-J, respectively, are available for connection to desired input leads of OR gates 3-1 through 3-K within OR array 3. As shown in FIG. 1, each OR gate 3-1 through 3-K is a J input lead device, although for simplicity only a single input line is shown for each OR gate 3-1 through 3-K. Again, Xs indicate the low impedance connection between one input lead of a given OR gate and a product term output line 5-1 through 5-J. Each OR gate 3-1 through 3-K includes an output lead 6-1 through 6-K, respectively, for providing an output signal as a result of the sum operation of the product terms connected to the input leads of that OR gate. In some PLDs, one or both of the AND and OR arrays are user programmable, thereby allowing wide flexibility in programming the PLD.

Programmable Logic Arrays (PLAs) are well known in the prior art, and a variety of PLA circuits are described in the U.S. Pat. Nos. 4,506,173; 4,617,649; 4,124,899; 4,703,206; 3,849,638; 4,422,072; and 4,293,783.

As the size of PLDs increases, power consumption and parasitic capacitances are increased. Therefore, a number of attempts have been made to alter the architecture of PLDs in order to enhance their performance as their size grows. One example of a prior art PLD is shown in U.S. Pat. No. 4,675,556. This prior art PLD provides a finite state machine formed using a programmable logic array circuit. Based upon the state defined by the device's state registers at any given time, selected ones of the product term AND gates are disabled by disabling their current sources, thereby reducing power consumption of the device as compared with other prior art devices in which the current sources associated with all product terms always enabled and thus always supplying current. The '556 circuit provides that, at all times, all product terms from the AND array are actively sensed and drive the OR array. Thus, the '556 circuit provides that the number and length (and hence capacitance) of the input leads to each OR gate is dictated by the size of the PLD device. Accordingly, as the size of PLD structures made according to the '556 architecture increases, capacitive loading of these lines will increase, with subsequent deleterious effect on the speed, power and size of the OR array of the PLD device. Other problems may occur due to switching current sources, such as noise.

U.S. Pat. No. 4,495,590 describes the construction of a Programmable Logic Array (PLA) circuit which emulates two separate PLAs utilizing time division multiplexing to multiplex input leads to AND gates. Time division multiplexing is also used to enable a desired set of OR gate output leads for providing sum term output signals. While this may allow for dense packaging of a plurality of PLAs on a single integrated circuit depending on the input/output structures used, the AND array is not partitioned, and thus each input lead of each AND gate is capable of being connected to each input signal, thereby causing the input lead of each AND gate to have high capacitance and thus relatively long time constant. Furthermore, the '590 structure does not partition the OR array, thus allowing each input lead of each OR gate to be selectively connected to each product term signal, thereby causing the input leads of the OR gates to have high capacitance and thus a relatively long time constant. With increased product terms, the performance of the '590 device degrades and power requirements increase. Furthermore, the '590 structure provides that selected inputs and outputs of AND gates and OR gates are enabled and disabled in an unvarying sequence based upon a counter or a fixed timing circuit. This may be useful only in a limited number of applications, for example in a pipelined multiplier structure as described in the '590 patent.

U.S. Pat. No. 4,233,667 describes a programmable logic array in which programmable (Product Term) circuitry is provided to determine whether a useful logical function is to be performed in the OR array of the PLA in response to the input signals. If not, power to a portion of the PLA OR array is turned off, thereby reducing power consumption. In the '667 device, all input leads are available to each AND gate and each product term is available to the input lead of each OR gate, at any given time. In the '667 structure the number of input leads to the AND array, or the number of devices connected to the input lead of the AND array, the number of the product term lines from the AND array, and thus the number of devices connected to the input leads of the OR array are not reduced as compared with prior art structures. Thus the capacitance of these lines and, in turn, the speed and power consumption of the device, is not improved over the prior art.

U.S. Pat. No. 4,660,171 describes a PLA used for decoding an operation code and providing a plurality of sequential output states. In operation, the '171 circuit receives an operation code as an input signal to a single AND array, resulting in a product term output signal from the AND array. This single product term output signal is used for a plurality of time periods, by manipulating the single product term output signal utilizing a dedicated counter and decoders, in order to provide a plurality of input signals, one per time period, to a single OR array. The '171 structure does not partition the AND or the OR arrays and thus has the same problems as typical prior art PLA devices, as the number of gates in the device increases. Furthermore, in order to accomplish its stated purpose, the '171 structure actually increases the number of inputs to the OR array by a factor of 4 for a given number of gates in the AND array.

Whitley, IBM Technical Disclosure Bulletin, Vol. 24, No. 6, Nov. 19, 1981, pages 2747–2748 describes a PLA that includes bit-partitioning techniques requiring fixed decode circuitry for decoding pairs of input signals into decoded output signals for application to the AND array and the OR array. This increases the capacitance associated with the input leads of each OR gate in the OR array, and does not reduce the number of active product terms.

Greenspan, IBM Technial Disclosure Bulletin, Vol. 19, No. 5, Oct. 1976, pages 1780–1781 describes the use of bit-partitioning logic as does Whitley, and includes wiring bus 26 which serves as a cross point switch. This increases the number of input leads to each OR gate in the OR array, thereby increasing the input capacitance of each OR gate, increasing the time constant. Furthermore, this structure does not result in a reduction in the number of product term selected at any given time.

U.S. Pat. No. 3,593,317 describes a PLA utilizing an input decoder and a plurality of storage elements which, in conjunction with logic gates, perform a masking function. The '317 structure requires a fixed decode circuitry, fixed gating circuitry and storage elements, all of which add additional overhead to the conventional circuitry of a PLA.

U.S. Pat. No. 4,742,252 describes a circuit including multiple programmable logic arrays without providing, within each programmable logic array, a plurality of product term configurations or partitions which are individually selected. This continuous AND array feeding a fixed OR array structure provides no performance benefit over conventional PLAs.

U.S. Pat. No. 4,034,356 describes a structure including a number of AND/OR array groups having common addressing lines. The groups of arrays are separated from each other by gating circuitry and latches which allows interconnection among the AND/OR groups to allow the circuit to be configured to perform desired functions. Storage of data is provided within each array group, and a two-phase clock signal is utilized to control the logic circuitry and latches performing the interconnection. The need for latching and gating control circuitry adds additional circuit requirements to a standard PLA device. Additional circuit restrictions are necessary when a two-phase clock is utilized.

It has become increasingly advantageous to increase the number of input leads to a PLA, the number of output leads from a PLA, and the number of product and sum terms within the PLA. This, of course, means that the PLA is correspondingly larger. It is also desirable to make the operation of the PLA as fast as possible, while minimizing power consumption. Unfortunately, the power consumption and physical area of a PLA is portional to the number of gates of the PLA and the speed of operation of the PLA. Therefore, there continues to be a great need for high speed PLAs having a larger number of product and sum terms while requiring low power consumption and smaller integrated circuit surface area.

BRIEF DESCRIPTION OF THE DRAWINGS

FIGS. 5a through 5d depict various embodiments of this invention in which page selection is controlled by internal circuitry in response to input signals, present states, or past states;

FIG. 9b depicts one embodiment of a programmable multiplexer suitable for use in the structure of FIG. 9a.

SUMMARY

In accordance with the teachings of this invention, programmable logic devices are taught allowing a large number of product terms and/or a large number of sum terms while providing smaller array size, higher speed, and lower power consumption than PLAs of comparable size if constructed in accordance with the teachings of the prior art. The PLAs of this invention are organized into a plurality of pages of programmable logic arrays, including means for selecting an appropriate subset of one or more of the plurality of total available pages for operation at any given time. Means are provided for switching pages when necessary in response to input signals including, if desired, signals fed back from the output leads of the PLA, or internal leads within the PLA. By having only a selected one or more of the pages of the PLA operable at any given time, the number of product and sum terms functioning at any given time is significantly less than the total number of product and sum terms available in the device, thereby minimizing power consumption. Furthermore, by utilizing a paged architecture in accordance with the teachings of this invention, speed is increased and power consumption reduced since the number of leads connected to, and thus the capacitance of, the sum and/or product term lines is reduced. Utilizing a paged architecture as taught by this invention results in not all product and sum terms being available at any given time. However, the vast majority of PLD applications which require a large total number of product terms and sum terms do not require, at any given time for any given set of input signals, that more than a relatively small number of the total number of product and sum terms be available for evaluation. Accordingly, a reduction in the number of product and sum terms which are made available at any given time serves as no real limitation on the use of the PLD, while such a reduction in the number of product and sum terms available at any given time allow the use of a paged architecture as taught by this invention, with the attendant benefits of reduced power and increased performance.

DETAILED DESCRIPTION

General Embodiment

Figure 2:
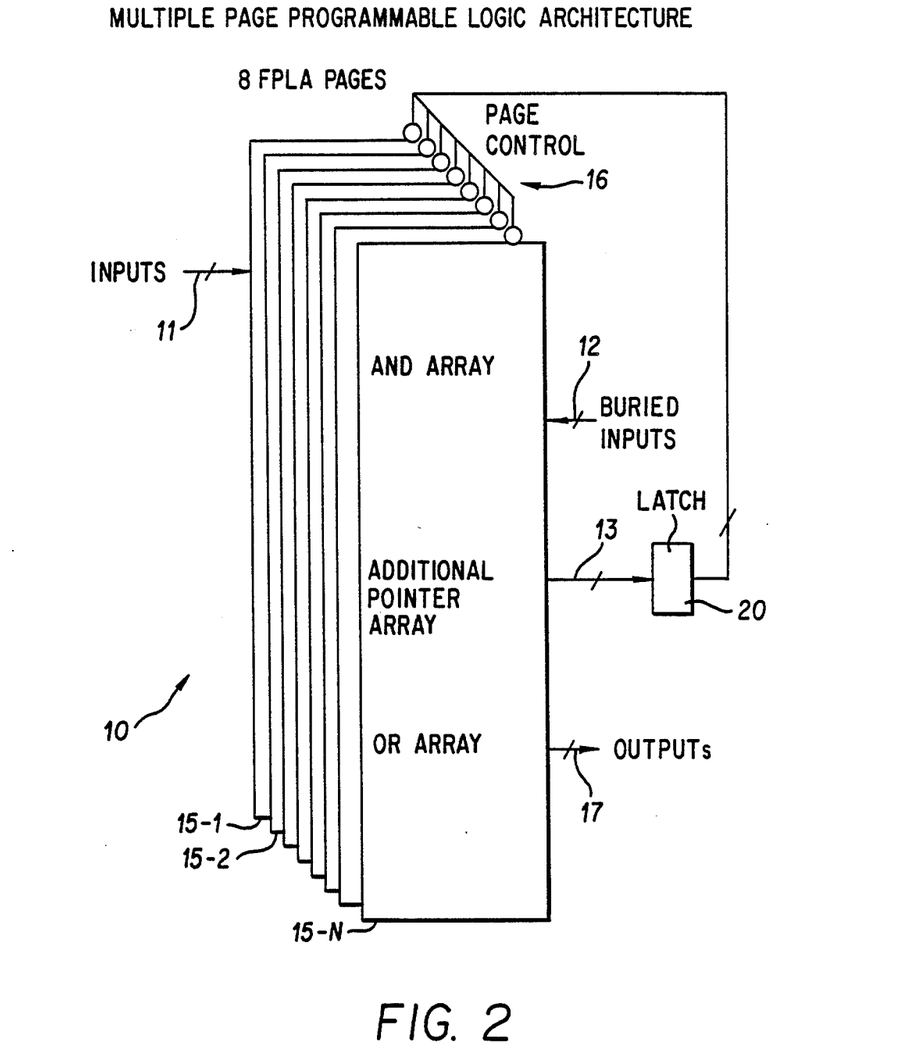
FIG. 2 is a diagram depicting a multiple page programmable logic array device constructed in accordance with the teachings of this invention.

FIG. 2 is a general block diagram of one embodiment of a multiple page programmable logic device constructed in accordance with the teachings of this invention. PLD 10 of FIG. 2 includes a plurality of pages 15-1 through 15-N, each page serving as a separate programmable logic array including an AND array, an OR array, and an additional pointer array which defines which one of pages 15-1 through 15-N is selected. Either one or both of the AND array and OR array within each page 15-1 through 15-N can be fabricated to be programmable by the user. Alternatively, each of the AND and OR arrays within each page are programmed during fabrication to form a hard wired logic array, or only one of the AND and OR arrays within each page is programmable either during fabrication or by the user. Alternatively, if desired different pages can have different configurations. In other words, it is possible for one page to provide a user programmable AND array and a fixed OR array, another page to provide a user programmable OR array and a fixed AND array, and yet another page to provide both a programmable AND array and a programmable OR array, etc. Each page is configured to include a first array and a second array, one or both of the first and second arrays including a desired configuration of logic gates, including AND, OR, NAND, NOR, exclusive OR, etc., gates. Although the teachings of this invention are applicable to PLDs capable of utilizing a wide range of array types which, if desired, intermix the type of logic gates contained therein, this specification will discuss those embodiments in which the first logic array is an AND array, and the second logic array is an OR array.

A plurality of input leads forming input bus 11 are provided for receiving a plurality of input signals and applying each input signal to each of pages 15-1 through 15-N. If desired, one or more buried input leads forming bus 12 provide signals from the output leads 14 of the OR array which are applied to the AND array in the same manner as are the input signals on the input leads of input bus 11. Within a given page, the AND array provides a plurality of product terms which drive the OR array, which in turn provide sum term output signals on bus 14. In this embodiment, the OR array of the selected page includes a page pointer array for selecting the next desired page in response to the logical array operation on the input signals received on bus 11 and/or the buried input signals on bus 12. The output signal from the additional pointer array contained within the page when selected is provided on bus 13 to page control circuitry to allow the appropriate one of pages 15-1 through 15-N to be selected. Page selection data from bus 13 can be applied to page control circuitry 16 in a convenient fashion. In one embodiment, the input signals are directly connected to page selection circuitry 16. In another embodiment, as shown in FIG. 2, the signals are stored in latch 20 prior to application to page control circuitry 16. In one embodiment, regardless of whether the page control signals are latched page control signals on bus 13 are encoded, such that A leads in page control bus 13 which can be used to control $2^A$ pages. In this event, a suitable decoder means is included in order to decode the signals on bus 13 and provide decoded signals to page control circuitry 16. In another embodiment, regardless of whether the page control signals are latched page control signals on bus 13 are dedicated, such that A leads in bus 13 can control A pages.

In accordance with the teachings of this invention, the multiple page programmable logic architecture offers improved speed as compared with programmable logic arrays having a comparable number of input leads, product terms, and sum terms which are constructed in accordance with prior art techniques, since the multiple page architecture of this invention provides for the enablement of a relatively small number of product and sum terms at any given time. Alternatively, for a given operating speed or power consumption, the multiple page programmable logic architecture as taught by this invention allows a greater number of total product and sum terms, although only a relatively small number of these product and sum terms are enabled at any given time.

Suitably fast page control circuitry 16 allows pages 15-1 through 15-N to enable and execute a given page's logic terms without delay and thus emulate a very large continuous programmable logic array which is capable of executing all available logic terms. The programmable logic array of this invention is particularly well suited for sequential PLA applications, where all logic transition terms are not required at any given clock transition thus allowing individual pages to be used, with the individual pages being programmed to include all of the logic transition terms which would be required at the time that page is selected. By allowing the use of pages, a high density PLA utilizing several hundreds of product terms can be fabricated while still operating at the same performance standards of a typical prior art small PLA with well less than one hundred product terms. In addition, the use of a plurality of pages in accordance with the teachings of this invention provides for a reduction in the number of actively transitioning product terms, thereby reducing the power consumption and internal noise of the device. In the OR array, the sum term line capacitance is greatly reduced, allowing an increase in speed as compared with a prior art device of comparable total size, since a fewer number of product terms are applied to the OR array. The reduction in the number of sum terms also dramatically reduces the size of the OR array. Furthermore, the number of sense amplifiers required is at most the number of sense amplifiers required for the maximum number of sum terms selected at any given time, thereby reducing power, increasing speed, and reducing the complexity of the circuit with respect to sense amplifiers and associated circuitry. Furthermore, with fewer sense amplifiers required, the size of the device is reduced, thereby enhancing product yield and reducing cost.

INPUT STRUCTURES

Shared Input Leads

Figure 3A:
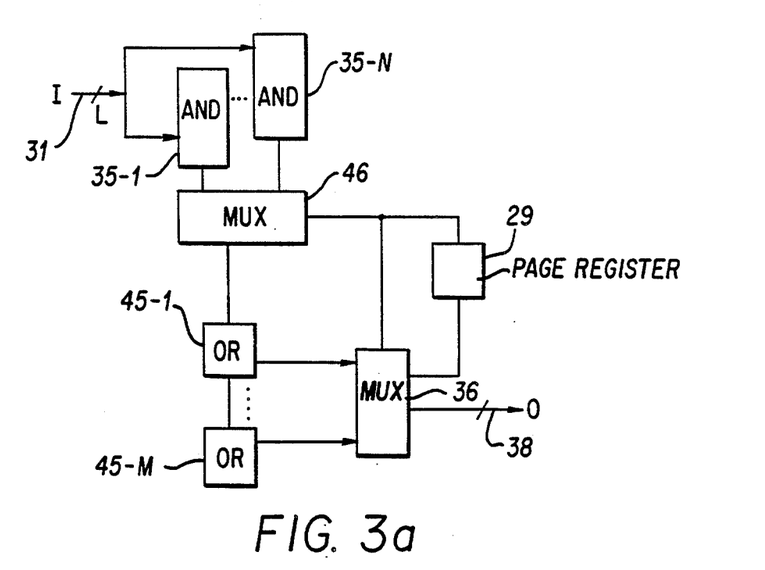
FIGS. 3a through 3d depict alternative input/output structures suitable for use with the structure of this invention.

Any one of a number of techniques and structures may be utilized to allow the input signals to be applied to the paged AND arrays. In one embodiment, as shown in FIG. 3a, all L input leads of input bus 31 are shared among all AND array pages 35-1 through 35-N, just as typical prior art PLAs share input leads among the AND array in a non-paged architecture.

Dedicated Input Leads

Figure 3B:
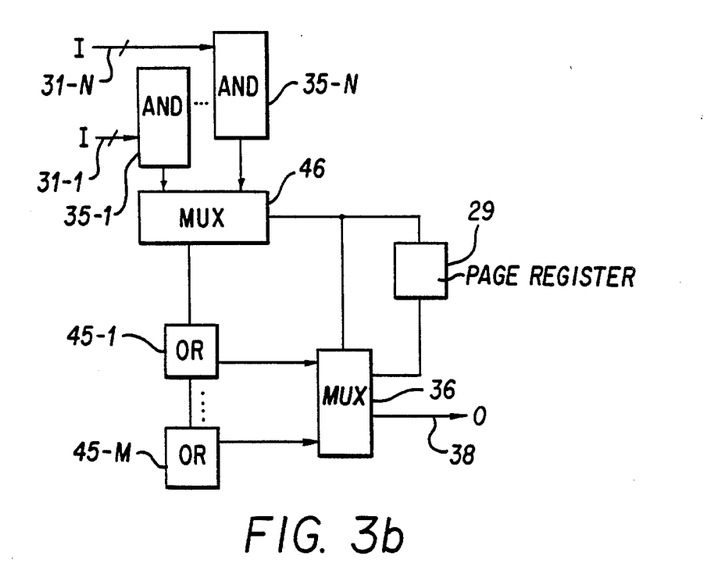

Alternatively, as shown in FIG. 3b, one embodiment of this invention provides that each AND array is associated with specific dedicated ones of the L input leads of the integrated circuit. Thus, AND array page 35-1 is associated with one or more input leads forming input bus 31-1, AND array page 35-N is associated with one or more input leads forming input bus 31-N, and so forth. If desired each AND array page may be associated with a different number of input leads.

Shared and Dedicated Input Leads

In an alternative embodiment, certain ones of the L input leads are dedicated to specific ones of AND array pages 35-1 through 35-N, and other ones of the L input leads are shared, for example by hard wiring, among a number of AND array pages 15-1 through 15-N, as described above with regard to FIG. 3a. Such sharing of input leads can take any desired permutation such that certain leads are dedicated to single AND array pages, certain other leads are shared among, for example, two AND array pages, other input leads are shared among different two AND array pages, and yet other input leads are shared among more than two AND array pages.

Fixed Multiplexing of Input Leads

Figures 3C, 3D:
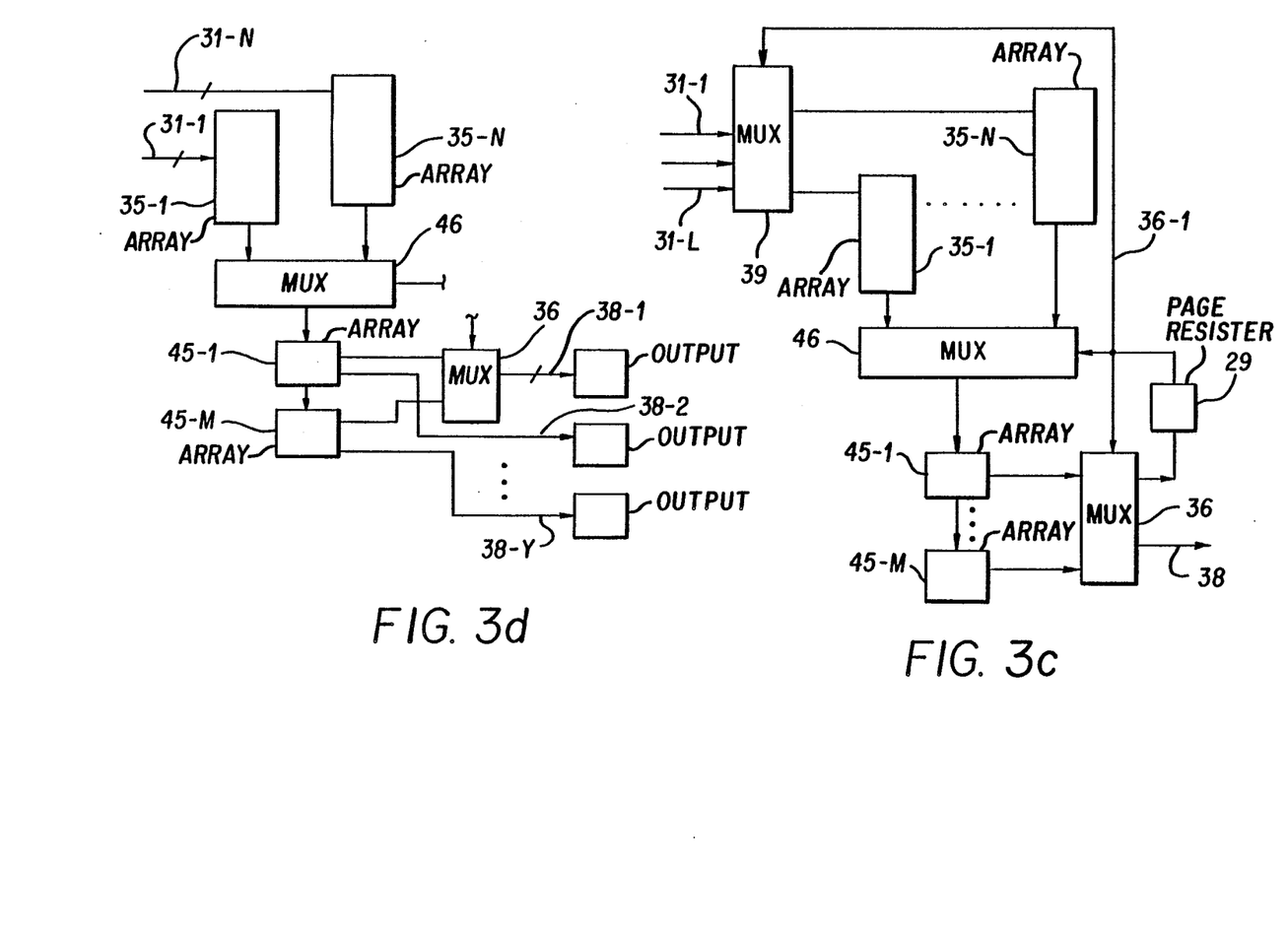

Another embodiment is shown in FIG. 3c, and utilizes multiplexer 39 to multiplex input leads 31-1 through 31-L for application to a desired one of AND array pages 35-1 through 35-N. In other words, utilizing the page select control signal, which in the embodiment of FIG. 3c is provided by page register 29 via leads 36-1, a desired one of AND gate pages 35-1 through 35-N is selected by multiplexer 46, a desired one of OR array pages 45-1 through 45-M is selected by multiplexer 36, and appropriate ones of input leads 31-1 through 31-L are applied by multiplexer 39 to the selected one of AND array pages 35-1 through 35-N.

Programmable Multiplexing of Input Leads

Figure 8:
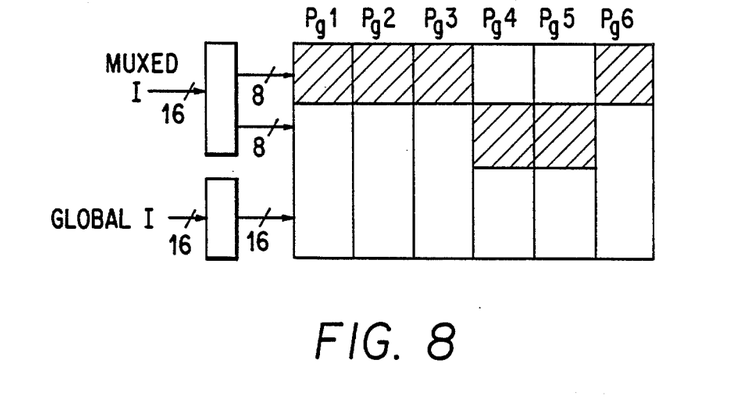
FIGS. 8 and 9a depict one embodiment of this invention which includes means for selecting various input or output signals for application to the selected page in accordance with a desired control logic pattern defined by the user's application.

FIG. 8 depicts the operation of one embodiment of this invention in which input leads are multiplexed in a user programmable order to provide a different set of input signals to the first logic array based upon which page is selected. In the example shown in FIG. 8, a total of 32 input leads are provided, which may be either input leads from external sources, or buried input leads. Sixteen of these input leads are global input leads and are always applied regardless of which page is selected. The other 16 leads are multiplexed input leads, with a selected subset applied depending upon which page is selected. Thus, in the example of FIG. 8, pages 1, 2, 3 and 6 receive a set of eight multiplexed input signals, and pages 4 and 5 receive the remaining eight of the multiplexed input signals. In this manner, pages 1 through 6 can receive any desired subset of input signals, thereby minimizing the sizes of page 1 through 6 while allowing a greater total number of input signals to be utilized.

Figure 9A:
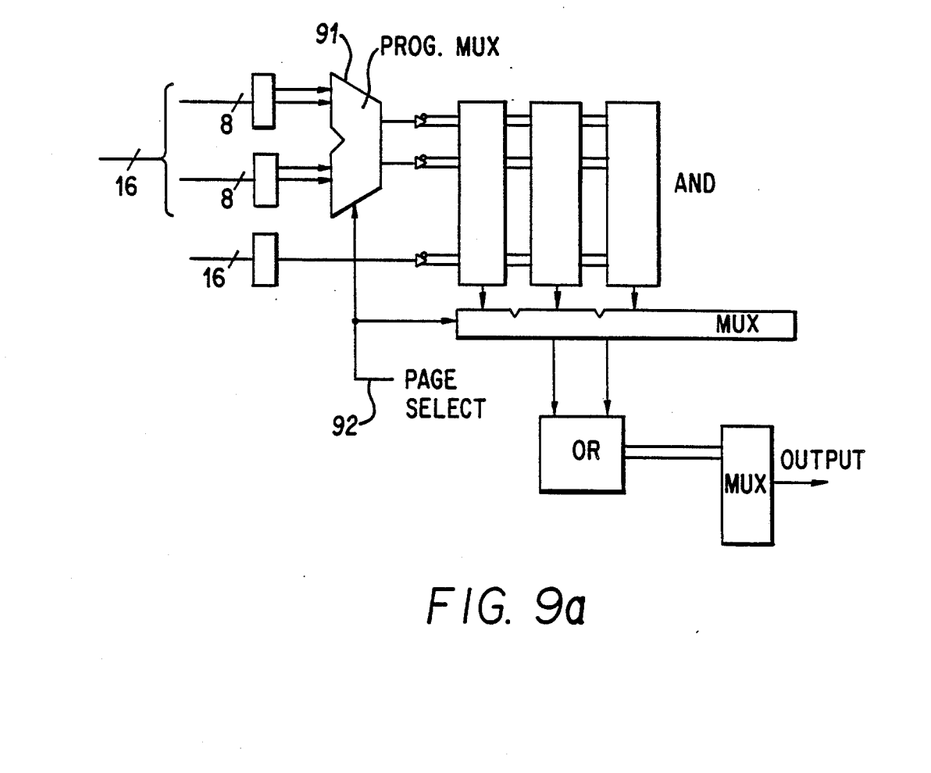

As shown in FIG. 9a, the selection of multiplexed input signals which are applied to each page can be provided utilizing programmable multiplexer 91 which operates in response to page select signal on lead 92 which is, for example, provided by one of the above described techniques.

Figure 9B:
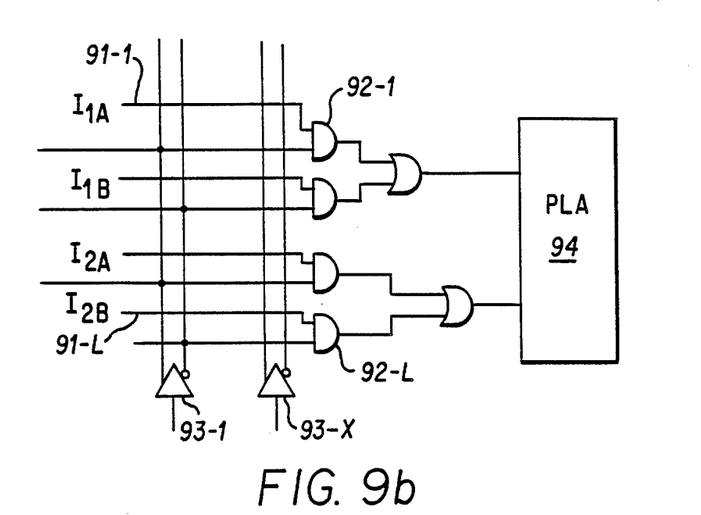

FIG. 9b depicts one embodiment of a programmable multiplexer suitable for use in the structure of FIG. 9a. The plurality of input leads 91-1 through 91-L are applied to one input lead of masking AND gates 92-1 through 92-L, whose other input leads are applied by programmable connections (shown as Xs) to signals provided by programmable multiplexer input buffers 93-1 through 93-X. In this manner, when 93-1 is selected, for example either dependently or independently from the selection of logic array pages, signals are applied to one input lead of each of masking AND gates 92-1 to 92-X thereby either enabling or disabling that AND gate from providing its associated input signal on leads 91-1 through 91-L to a programmable logic array device 94.

OUTPUT STRUCTURES

As with the input leads, the output leads can take any number of desired configurations, in a similar fashion as the input signals to the AND array. For example, in a manner similar to that shown in FIG. 3a with regard to input leads, all output leads of output bus 38 are shared among all OR arrays, for example with the unselected OR arrays being disabled so as not to interfere with proper output signals from the selected OR array.

In an alternative embodiment, as shown in FIG. 3d, some specific output leads from various OR arrays are dedicated to specific output leads of the device, while other output leads of the OR array are multiplexed to output leads of the device. Other embodiments shown in FIGS. 3a through 3c, include multiplexer 36 to select the output signals from a selected OR array 45-1 through 45-M for connection to output bus 38. As is well known to those of ordinary skill in the art, the output bus can include registers or latches, if desired, including means for selectively enabling latches, if desired. Registered or unregistered output signals can, if desired, be fed back either to one or all of AND arrays 35-1 through 35-N, or to one or all of OR arrays 45-1 through 45-M.

PAGE CONTROL

Independent AND Page Control and OR Page Control

The discussion has thus far shown that an AND array is selected utilizing the same means as is used for selecting an OR array, thus essentially providing a plurality of pages each consisting of a specific AND array and a specific OR array. However, it is to be understood that independent paging circuitry is used in certain embodiments of this invention, wherein a desired one of the AND array pages is selected independently from the selection of a desired one of the OR array pages. In such embodiments, selecting a different one of the AND array pages may or may not coincide with the selection of a different one of the OR array pages, and vice versa, allowing great versatility in paging. In alternative embodiments of this invention, a plurality of AND array pages are utilized in conjuction with a fixed OR array which is always being selected. Conversely, in another embodiment of this invention a single AND array is utilized which is always selected in conjunction with a plurality of OR array pages, one or more of which are selected as needed.

Page Selection By External Pins

Figure 4A:
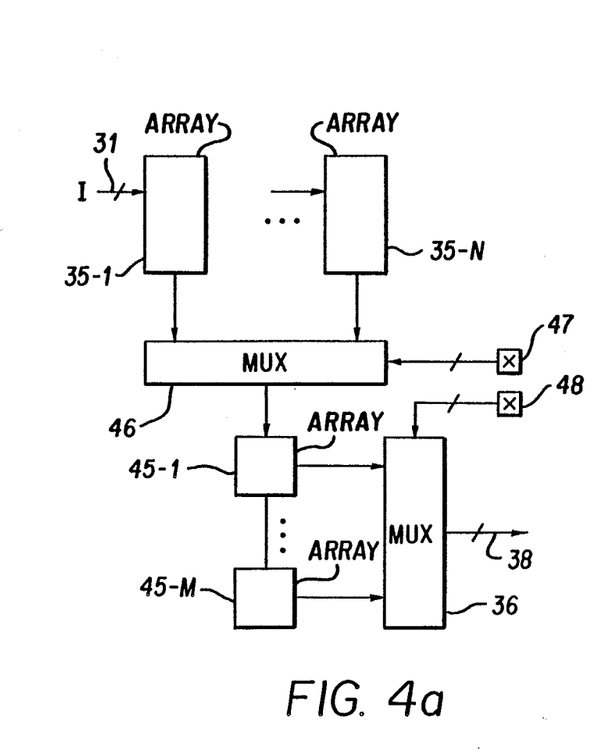
FIGS. 4a and 4b depict alternative embodiments of this invention wherein page selection is controlled by signals applied to external pin.

In accordance with the teachings of this invention, a number of methods and structures are suitable for use in controlling the selection of the desired one of AND array pages and OR array pages utilizing external page selection signals applied to dedicated pins. These external page selections signals may be either encoded such that A page selection bits provide control of $2^A$ page selection control possibilities, or dedicated such that A page selection control bits provide A page selection control possibilities. For example, as shown in FIG. 4a, two sets of dedicated input pins 47 and 48 are utilized to independently select via multiplexers 46 and 36, respectively, the desired one of AND array pages 35-1 to 35-N and the desired one of OR array pages 45-1 through 45-M. Utilizing AND array page control pin set 47 independently from OR array page control pin set 48 allows independent AND and OR array paging. In alternative embodiments, only a single set of page selection pins is utilized, with the non-paged array being fixed and always selected. In yet another embodiment, a single set of page selection pins is utilized which simultaneously selects the appropriate one of AND array pages 35-1 through 35-N and OR array pages 45-1 through 45-M. Utilizing such external pins for page control allows selection of the next page or pages in response to an externally supplied page control signal or signals.

Figure 4B:
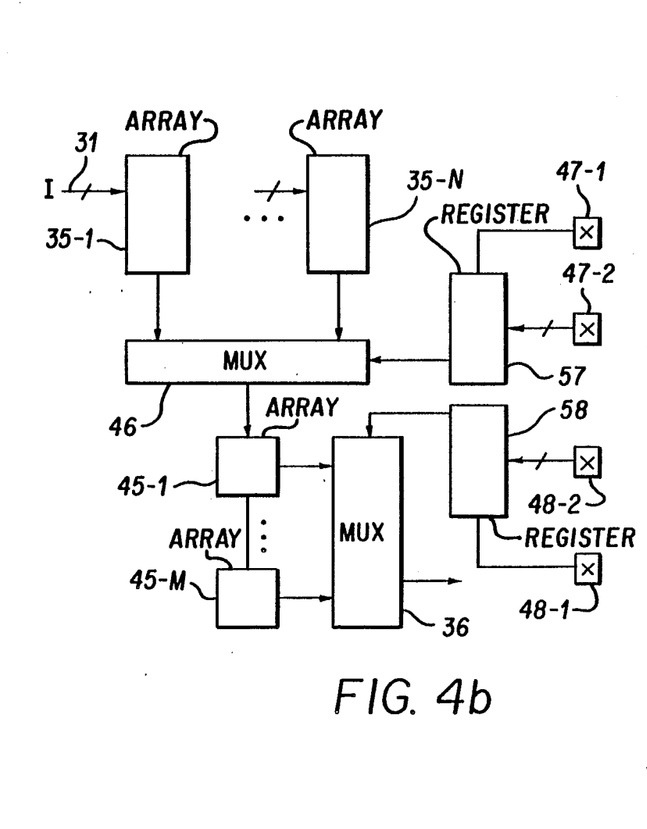

In an alternative embodiment, as shown in FIG. 4b, AND array page register 57 and OR array page register 58 are utilized for storing information received via external pins. The information in registers 57 and 58 causes multiplexers 46 and 36 to select an appropriate one of AND array pages 35-1 through 35-N and OR array pages 45-1 through 45-M, respectively. As shown in FIG. 4b, AND array page register 57 receives either a serial data stream via input pin 47-1 or other data via a set 47-2 of external pins. Such other data may comprise a parallel word. Alternatively, pin 47-2 can receive external information indicating that register 57 should increment or decrement its count by a specified number, for example. Other techniques can be utilized, for example providing a binary number which is to be added to or substracted from the contents of register 57. The operation of OR array page control 58 is similar to the operation of AND array page control register 57. In one embodiment, only a single page control register is used, with the other array being fixed, rather than paged. In yet another embodiment of this invention, a single page control register is utilized which controls the operation of both multiplexers 46 and 36, thereby selecting AND array pages and OR array pages simultaneously based on a single set of external page control data.

Page Selection Via Internal Logic Control

Any one of a number of different methods and structures is utilized in order to implement page selection of AND arrays and/or OR arrays in response to input signals. In any of these embodiments, the page control signals can be encoded such that A page control leads can define $2^A$ page selection possibilities, or may utilize A dedicated page control leads defining A page control possibilities in accordance with the teachings of this invention. The teachings of this invention with regard to page control apply equally well regardless of the technique used for applying the input signals from bus 31 to each of the AND array pages or output signals to external devices, and similarly apply equally well to embodiments where only one of the AND array or OR array are paged.

1. Page Selection Utilizing Dedicated AND Array

In one embodiment, as shown in FIG. 5a, page control AND array 135 receives input signals from input bus 31, and provides product terms which control multiplexers 46 and 36. As previously described, the input signals from input bus 31 can be applied to AND arrays 135 and 35-1 through 35-N in any one of a number of manners. Similarly, a set of product terms from page control AND array 135 can be applied directly or via register 136 to one or both multiplexers 36 and 46, a first set of product terms can be applied from page control AND array 135 to multiplexer 36 and a second set of product terms applied to multiplexer 46 in order to page AND arrays and OR arrays independently, or a selected one of multiplexers 36 and 46 can be omitted, thereby allowing paging of only OR arrays, or only AND arrays, respectively.

2. Page Selection Utilizing Paged AND Arrays

In one embodiment, as shown in FIG. 5b, each AND array page 35-1 through 35-N includes an additional page pointer AND arrays 135-1 through 135-N, respectively. Multiplexer 46 serves to select the desired one of AND array pages 35-1 through 35-N, including page pointer arrays 135-1 through 135-N, respectively. The product terms of the selected one of page pointer arrays 135-1 through 135-N are, if desired, stored in register 98 and applied via lead 46-1 to control multiplexers 46 and 36, thereby selecting the appropriate one of AND array pages 35-1 through 35-N and OR array pages 45-1 through 45-M. If desired, signals from bus 46-1 are applied to both multiplexers 36 and 46, thereby causing selection of desired AND array pages and OR array pages in a dependent fashion, or separate bits from bus 46-1 are applied to multiplexers 36 and 46, allowing AND array page selection to be performed independently from OR array page selection. Alternatively, only AND array page selection is performed, (i.e. a single OR array is used) or only OR array page selection is performed (i.e. only a single AND array is utilized). Thus, in accordance with the embodiment of FIG. 5b, the AND array page which is active can thus determine the next page to be made active. In this manner, any transition term can select (based on inputs, present outputs, or buried states) which page is available on the next clock sequence.

3. Page Selection Utilizing OR Arrays Included In AND Array Pages

Figure 5C:
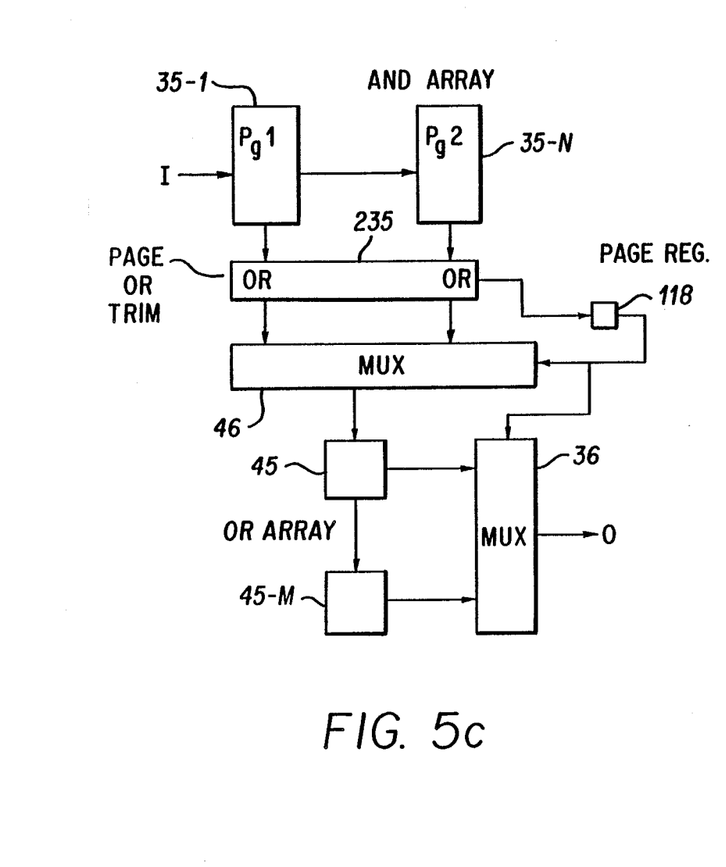

In one embodiment, shown in FIG. 5c, page control OR array 235 receives input signals from AND arrays 35-1 through 35-N, respectively. Paging OR array 235 provides sum terms which are, if desired, stored in page register 118 and which control multiplexers 46 and 36. As previous described, the input signals from input bus 31 can be applied to AND arrays 35-1 through 35-N in any one of a number of ways. Similarly, a set of sum terms from paging OR array 235 can be applied to one or both multiplexers 36 and 46, or a first set of sum terms can be applied from paging OR array 235 to multiplexer 36 and a second set of sum terms applied to multiplexer 46. Furthermore, a selected one of multiplexers 36 and 46 can be omitted, thereby allowing paging of only OR arrays, or only AND arrays, respectively.

4. Page Selection Utilizing Paged OR Arrays

Figure 5D:
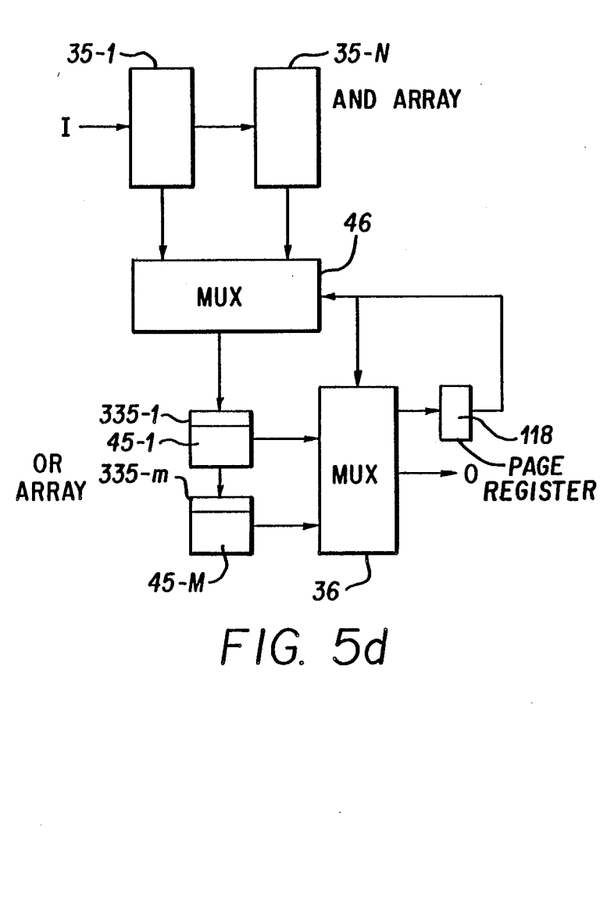

In one embodiment, as shown in FIG. 5d, each OR array page 45-1 through 45-M includes an additional page pointer OR array 335-1 through 335-M, respectively.

Page Selection Timing Requirements

A paged PLA constructed in accordance with the teachings of this invention will operate as a continuous non-paged PLA provided the page selection does not degrade the speed at which output signals are generated in response to input signals. To insure that page selection is not in the critical path of operation, the time Tps it takes to select the next page must not effect the total set up time delay Tsu of input signals, either from input leads or buried output leads which are fed back as input signals, to the generation of output signals.

Thus, the set up time Tsu(ps) which is dependent on a new page selection must not be greater than the total set up time Tsu that requires no page selection, i.e., optimally $$Tsu(ps) = Tsu$$

This requires the page selection time to be much shorter than the total set up time. For a page selection propagation delay Tps from the clocked output signal from the page register, through page decode (if required), to a valid next page enable status, $$Tps << Tsu$$

Since in a typical PLA structure the input or buried output feedback signals must propagate through the AND array to provide product terms which are then applied to the OR array, the time required for selection of the next AND array page is more critical than the selection of the OR array page. In addition, in the embodiment where input signals are applied to all AND array pages simultaneously, and the product terms from the selected page are applied, via a multiplexer, to the selected OR array page, page selection must occur not later than the time at which valid product terms are available, if page selection is not to degrade the performance of operation of the PLA. For a feedback product term propagation delay TPTpd from the clocked buried register output signal, through the AND array input buffer and driver to provide a valid product term.

$$Tps < TPTpd$$

In other words, the next page of logic must be selected prior to receipt of the next set of clocked input signals. Since the next page of logic is available prior to the next clock edge, a paged PLA constructed in accordance with the teachings of this invention emulates the logical equivalent of a continuous PLA, with no degradation in performance due to paging.

Figure 6:
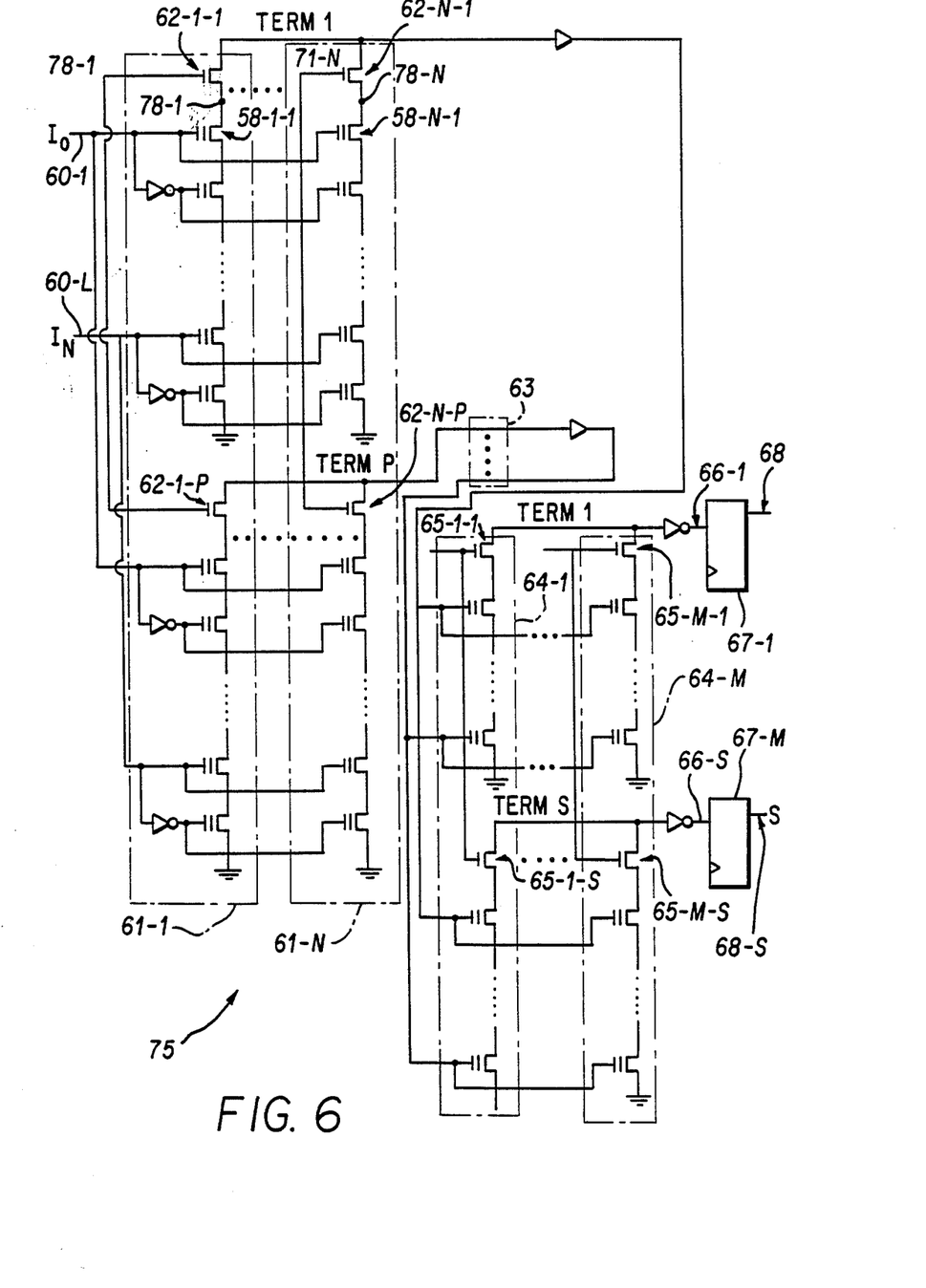
FIG. 6 depicts the operation of one embodiment of this invention wherein the time required to select the next page is less than the time required for a new set of input signals to propatage through the first logic array.

FIG. 6 depicts one embodiment of a PLA constructed in accordance with the teachings of this invention which illustrates the timing relationships with regard to input to output signal propagation and page selection. PLA device 75 includes a plurality of input leads 60-1 through 60-L. A first set of logic array pages 61-1 through 61-N are shown, each receiving a plurality of input signals and being selected by page selection transistor sets 62-1-1 to 62-1-P through page selection transistor set 62-N-1 to 62-N-P, respectively, where P is the number of output product terms per first array page. The output signals from a selected first page are applied via bus 63 to input leads of a second set of logic array pages 64-1 through 64-M. A desired one of logic pages array 64-1 through 64-M is selected by page selection transistor sets 65-1-1 to 65-1-S through 65-M-1 to 65-M-S, where S is the number of output terms per second array page. The output signal from the selected one of pages 64-1 through 64-M is applied via the associated one of leads 66-1 through 66-S to the associated one of registers 67-1 through 67-S for output on the associated one of output leads 68-1 through 68-S. Page selection registers (not shown, but any one or ones of registers 67-1 through 67-S can be used as page registers, if desired) operate in accordance with any one of the examples described above and provide (utilizing a page selection decoder, if necessary) decoded page selection signals to page selection transistors 62-1-1 through 62-N-P and 65-1-1 through 65-M-S.

The set up time Tsu is the time required between the application of input signals to input leads 60-1 through 60-L until output signals are provided on output leads 66-1 through 66-S. The page selection propagation delay time Tps is the time required for a signal to propagate from the page selection registers (not shown) through a page decoder (if required) to page selection transistors 62-1-1 through 62-N-P and 65-1-1 through 65-M-S, in order to select the desired pages. The feedback propagation delay TPTpd is the time required for the clocked output signal on buried output lead 68-1 to propagate to input lead 60-1, through an input buffer (not shown) to transistors 58-1-1 through 58-N-1. The requirement that Tps is less than TPTpd is provided, in the embodiment of FIG. 6, by providing that the capacitance on the page select transistor control lines 71-1 through 71-N is significantly less than the capacitance on input leads 60-1 through 60-L, thereby providing that the speed of selecting a page is much faster than the speed of propagation of an input signal to product term nodes 78-1 through 78-N.

Variable Page Sizes

Figure 7:
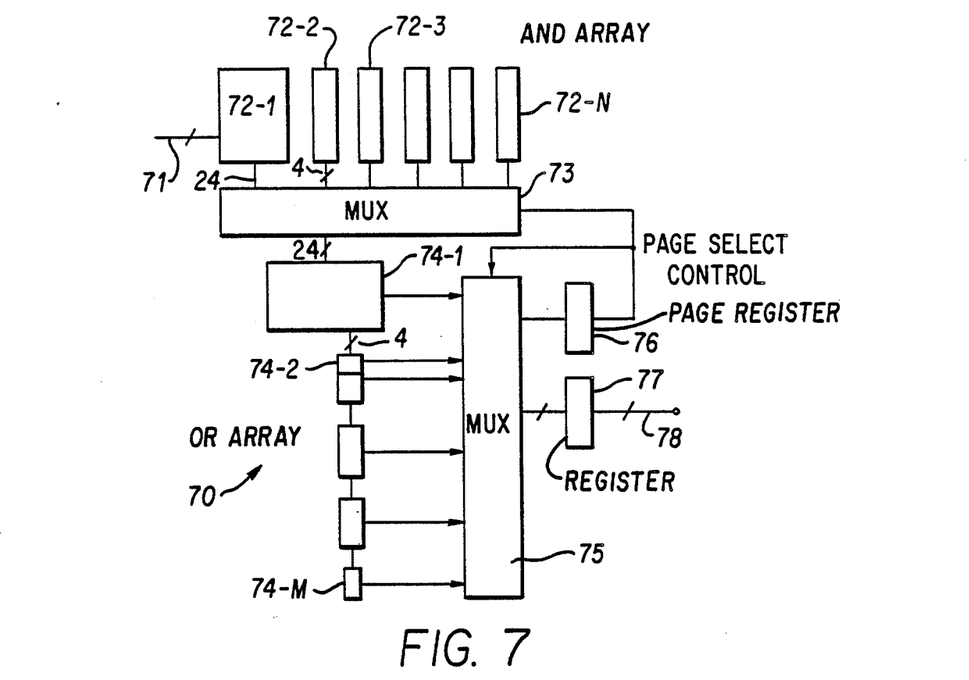
FIG. 7 is a diagram depicting one embodiment of a device constructed in accordance with the teachings of this invention which includes pages of various sizes.

FIG. 7 shows one embodiment of a PLA constructed in accordance with the teachings of this invention which includes pages of various sizes. For example, the AND array consists of pages 72-1 through 72-N, of any convenient sizes. The number of input leads from input bus 71 connected to each of pages 72-1 through 72-N can be designed or programmed as desired, and the number of product terms from each of the pages 72-1 through 72-N can be as desired. As shown in FIG. 7, page 72-1 provides 24 product terms, and pages 72-2 through 72-N provide less than 24 product terms, for example four product terms each. Similarly, the OR array is configured into pages 74-1 through 74-M, and the example shown in FIG. 7 shows that page 74-1 receives 24 product terms, and pages 74-2 through 74-M receive less than 24 product terms, for example four product terms each. Page 74-1 can receive the 24 product terms from page 72-1, or up to 24 product terms from any selected configuration of AND array pages 72-2 through 72-N. Similarly, OR array pages 74-2 through 74-M can be selected individually to receive only four product terms which are selected by multiplexer 73, or can be configured such that a variety of pages 74-2 through 74-M are configured to each receive a separate set of product terms from multiplexers 73. In yet another embodiment, certain product terms are shared, i.e. applied simultaneously to more than one of pages 74-2 to 74-M, such that any permutation of product terms available from multiplexer 73 are applied to the selected set of pages 74-2 to 74-M.

Multiple Pages Selected Simultaneously

Figure 10:
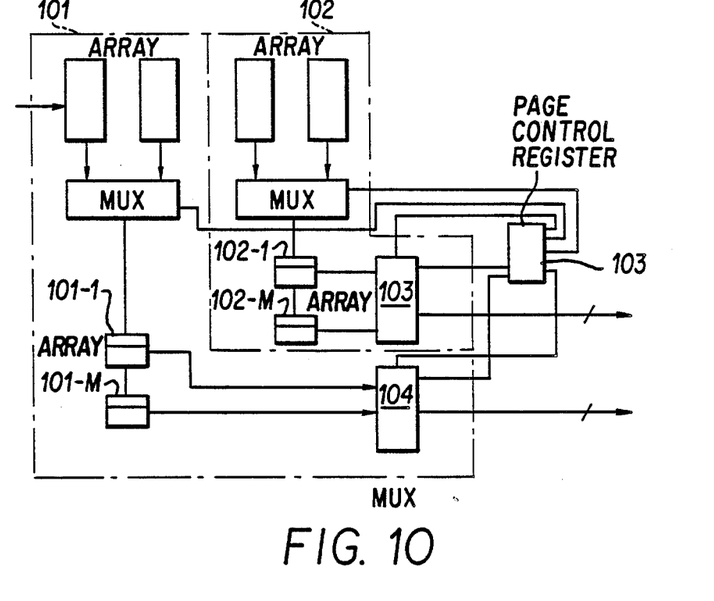
FIGS. 10 and 11 depict alternative embodiments of this invention in which multiple pages are simultaneously selected.

FIG. 10 depicts one embodiment of a PLA construction in accordance with the teachings of this invention in which multiple pages are enabled simultaneously. FIG. 10 depicts a structure including two separate PLAs 101 and 102 constructed in accordance with the teachings of this invention utilizing a single page control register 103 receiving page control signals via multiplexers 103 and 104 from page selection portions of each OR array page 101-1 through 101-M and 102-1 through 102-M.

Figure 11:
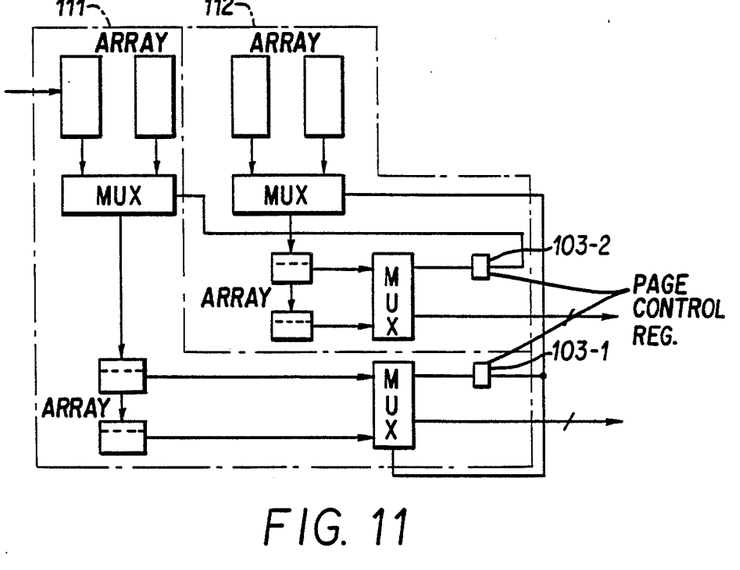

FIG. 11 depicts another embodiment including two PLAs 111 and 112 constructed in accordance with the teachings of this invention utilizing separate page control registers 103-1 and 103-2, respectively. In this manner, for example, two independent state machines can operate simultaneously while interacting and controlling each other.

Programming Tools

Ideally, software can be used in order to partition the users design to fit into a plurality of smaller pages of logic. The interrelationship between pages is accomplished by executing normal user programmable logic transition terms that drive a programmable page pointer OR array, for example. This additional programmable OR array then feeds the page select register which then selects the next page.

A special purpose PLA compiler can be used to optimally partition a large state machine design into multiple smaller pages and generate the transition term links between the smaller pages.

All publications and patent applications cited in this specification are herein incorporated by reference as if each individual publication or patent application were specifically and individually indicated to be incorporated by reference. Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A logic array circuit comprising:
    a plurality of L input leads for receiving a plurality of input signals, where L is a first positive integer;
    a set of N first logic arrays, where N is a second positive integer greater than or equal to one, each of said N first logic arrays including means for receiving signals related to selected ones of said input signals, a plurality of P intermediate output signal leads, a plurality of logic gates for providing P intermediate output signals on said P intermediate signal leads as a function of said signals related to selected ones of said input signals, where P is a third positive integer associated with that one of said N first logic arrays;
    means for selecting a subset of D of said first logic arrays, where D is a fourth positive integer greater than or equal to one;
    a set of M second logic arrays, where M is a fifth positive integer greater than or equal to one, each of said second logic arrays including one or more input leads for receiving input signals related to said intermediate output signals of said selected ones of said first logic arrays, a plurality of S output leads, where S is a positive integer, one or more logic gates for providing output signals on said S output leads as a function of said input signals of said second logic array;
    means for selecting a subset of G of said M second logic arrays for receiving said input signals related to said intermediate output signals of said set of D of said first logic arrays and providing a set of output signals, where G is a sixth positive integer; and
    means for controlling said means for selecting such that at least one of said means for selecting operates in response to one or more of said input signals.

2. A circuit as in claim 1 wherein set of first logic arrays and said set of second logic arrays are formed by any combination of logic arrays selected from the group of logic arrays consisting of AND, NAND, OR, NOR, XOR, XNOR, and combinations thereof.

3. A circuit as in claim 1 wherein some or all of said first and second logic arrays are user programmable.

4. A circuit as in claim 1 wherein said first logic arrays each simultaneously receive signals related to each of said L input leads.

5. A circuit as in claim 1 wherein said first logic arrays each simultaneously receive signals related to a unique subset of said L input signals.

6. A circuit as in claim 1 wherein said first logic arrays each simultaneously receive signals related to a subset of said L input signals, and each simultaneously receive signals related to a unique subset of said L input signals.

7. A circuit as in claim 1 which further comprises means for selecting a subset of said input signals for application to a selected one of said first logic arrays.

8. A circuit as in claim 7 wherein said means for selecting a subset operates in response to selected ones of said input signals.

9. A circuit as in claim 1 wherein said means for selecting operates independently, such that said subset of D of said first logic arrays is selected independently from the selection of said subset of G of said second logic arrays.

10. A circuit as in claim 1 wherein said means for selecting operate dependently, such that said subset of D of said first logic arrays is selected dependently with the selection of said subset of G of said second logic arrays.

11. A circuit as in claim 1 wherein N is equal to one.

12. A circuit as in claim 1 wherein M is equal to one.

13. A circuit as in claim 7 wherein said means for selecting a subset of said input signals operates independently from one or both of said means for selecting a subset of said first and second logic arrays.

14. A circuit as in claim 7 wherein said means for selecting a subset of said input signals operates dependently with one or both of said means for selecting a subset of said first and second logic arrays.

15. A circuit as in claim 1 wherein one or both of said means for selecting comprise multiplexers.

16. A circuit as in claim 1 wherein said means for selecting comprises a dedicated array of similar construction as said first logic arrays.

17. A circuit as in claim 1 wherein said means for selecting comprises a dedicated array of similar construction as said second logic arrays.

18. A circuit as in claim 1 wherein said means for selecting comprises:
   a set of H logic arrays of similar construction as said first logic arrays, where H is a seventh positive integer; and
   means for selecting a desired one of said H logic arrays for providing output signals defining which of said B first logic arrays and/or a desired one of said E second logic arrays are to be selected.

19. A circuit as in claim 18 wherein said means for selecting a desired one of said H logic arrays operates independently from the operation of said means for selecting a desired one of said B first logic arrays.

20. A circuit as in claim 18 wherein said means for selecting a desired one of said H logic arrays operates dependently with the operation of said means for selecting a desired one of said B first logic arrays.

21. A circuit as in claim 1 wherein said means for selecting comprises:
   a set of H logic arrays of similar construction as said second logic arrays, where H is a seventh positive integer; and
   means for selecting a desired one of said H logic arrays for providing output signals defining which of said B first logic arrays and/or a desired one of said E second logic arrays are to be selected.

22. A circuit as in claim 21 wherein said means for selecting a desired one of said H logic arrays operates independently from the operation of said means for selecting a desired one of said E second logic arrays.

23. A circuit as in claim 21 wherein said means for selecting a desired one of said H logic arrays operates dependently with the operation of said means for selecting a desired one of said E second logic arrays.

24. A circuit as in claim 1 wherein said means for selecting operates in response to encoded signals from said means for controlling.

25. A circuit as in claim 1 wherein said second logic arrays each simultaneously provide signals related to each of said S output leads.

26. A circuit as in claim 1 wherein said second logic arrays each simultaneously provide signals related to a unique subset of said S output signals.

27. A circuit as in claim 1 wherein said second logic arrays each simultaneously provide signals related to a subset of said S output signals.

28. A circuit as in claim 1 which further comprises additional means for selecting a subset of said second logic arrays for providing S output signals.

29. A circuit as in claim 28 wherein said additional means for selecting a subset operates in response to selected ones of said input signals.

30. A circuit as in claim 28 wherein said additional means for selecting a subset of said second arrays operates independently from one or both of said means for selecting a subset of said first and second logic arrays.

31. A circuit as in claim 7 wherein said additional means for selecting a subset of said second arrays operate dependently with one or both of said means for selecting a subset of said first and second logic arrays.

32. A circuit as in claim 28 wherein said additional means for selecting comprises one or more multiplexers.

* * * * *